(12) United States Patent
Adem

(10) Patent No.: US 7,115,498 B1
(45) Date of Patent: *Oct. 3, 2006

(54) METHOD OF ULTRA-LOW ENERGY ION IMPLANTATION TO FORM ALLOY LAYERS IN COPPER

(75) Inventor: Ercan Adem, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 10/803,852

(22) Filed: Mar. 18, 2004

Related U.S. Application Data

(63) Continuation of application No. 10/123,751, filed on Apr. 16, 2002, now abandoned.

(51) Int. Cl.
*H01L 21/4763* (2006.01)

(52) U.S. Cl. ............... 438/627; 438/629; 438/643; 438/644; 438/648; 438/653; 438/654; 438/656; 438/658; 438/659; 438/687

(58) Field of Classification Search ............... 438/627, 438/629, 643–644, 648, 653–654, 656, 658–659, 438/687

See application file for complete search history.

(56) References Cited

U.S. PATENT DOCUMENTS

| | | | |
|---|---|---|---|
| 6,268,291 B1 * | 7/2001 | Andricacos et al. | 438/694 |
| 6,420,262 B1 * | 7/2002 | Farrar | 438/652 |
| 6,589,874 B1 * | 7/2003 | Andricacos et al. | 438/694 |
| 6,703,307 B1 * | 3/2004 | Lopatin et al. | 438/653 |
| 6,770,559 B1 * | 8/2004 | Adem et al. | 438/637 |
| 6,800,554 B1 * | 10/2004 | Marieb et al. | 438/687 |
| 6,977,220 B1 * | 12/2005 | Marieb et al. | 438/659 |
| 2002/0115292 A1 * | 8/2002 | Andricacos et al. | 438/687 |
| 2004/0224507 A1 * | 11/2004 | Marieb et al. | 438/687 |

\* cited by examiner

*Primary Examiner*—Lynne A. Gurley
(74) *Attorney, Agent, or Firm*—Foley & Lardner LLP

(57) ABSTRACT

A method of fabricating an integrated circuit can include forming a barrier layer along lateral side walls and a bottom of a via aperture, forming a seed layer proximate and conformal to the barrier layer, and ion implanting elements into the seed layer. The via aperture is configured to receive a via material that electrically connects a first conductive layer and a second conductive layer.

17 Claims, 3 Drawing Sheets

METHOD OF ULTRA-LOW ENERGY ION IMPLANTATION TO FORM ALLOY LAYERS IN COPPER

CROSS REFERENCE TO RELATED APPLICATIONS

This application is related to U.S. patent application Ser. No. 09/994,358, entitled METHOD OF IMPLANTATION AFTER COPPER SEED DEPOSITION filed on Nov. 26, 2001, which is assigned to the same assignee as this application.

FIELD OF THE INVENTION

The present invention relates generally to integrated circuits and methods of manufacturing integrated circuits. More particularly, the present invention relates to ion implantation to form alloy layers in a copper layer.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. For example, a via can connect a gate above the substrate to a conductor line in the metal 1 layer. Vias can also interconnect conductive lines. For example, a via can connect a conductive line in a metal 1 layer to a conductor line in a metal 2 layer. A via is typically a metal plug which extends through an insulative layer in a multilayer integrated circuit. Vias and barrier layers are discussed in U.S. Pat. Nos. 5,646,448; 5,770,519; and 5,639,691; each of which are assigned to the assignee of the present application.

A barrier layer is used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

Integrated circuit manufacturers have attempted to reduce via resistance as the via size decreases by reducing the thickness of the barrier material. According to a conventional physical vapor deposition (PVD) process, IC manufacturers deposit a very thin barrier material at the bottom of the via due to non-conformal deposition. The thickness of the barrier material is reduced by chemical vapor deposition (CVD) or atomic layer deposition (ALD) processes. These advanced deposition processes form highly conformal barrier metal films of relatively small thickness. However, reducing the barrier thickness causes the barrier to become more permeable to copper (Cu) diffusion, which can adversely affect resistance to electromigration.

Electromigration failures have been described by Stanley Wolf, Ph.D. in *Silicon Processing for the VLSI Era*, Lattice Press, Sunset Beach, Calif., Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

A seed layer can be used to help electroplate Cu from an electrolyte solution onto vias and trenches with full Cu fill without voids. Generally, the Cu seed can be sputtered from a manufactured solid Cu targets. However, the manufacture of some Cu-alloy solid targets can be difficult due to poor metallurgical and mechanical properties of the resulting solid target. The alloying elements may not be uniformly incorporated or may be in a non-pure form which results in poor target erosion and insufficient concentration in the seed layer.

Thus, there is a need for a method of ion implantation to form alloy layers in copper. Further, there is a need for a method of forming a seed layer without manufacturing copper alloy targets. Even further, there is a need for implanting elements into seed layer using a low energy ion implantation process.

SUMMARY OF THE INVENTION

An exemplary embodiment is related to a method of fabricating an integrated circuit. This method can include forming a barrier layer along lateral side walls and a bottom of a via aperture, forming a seed layer proximate and conformal to the barrier layer, and ion implanting elements into the seed layer. The via aperture is configured to receive a via material that electrically connects a first conductive layer and a second conductive layer.

Another exemplary embodiment is related to a method of implantation after copper seed deposition in an integrated circuit fabrication process. This method can include providing a first conductive layer over an integrated circuit substrate, providing a conformal layer section at a bottom and sides of a via aperture positioned over the first conductive layer to form a barrier separating the via aperture from the first conductive layer, providing an ultra-low energy ion implant to form a seed layer over the conformal layer, filling the via aperture with a via material, and providing a second conductive layer over the via material such that the via material electrically connects the first conductive layer to the second conductive layer.

Another exemplary embodiment is related to a method of forming a via in an integrated circuit. This method can include depositing a first conductive layer, depositing an etch stop layer over the first conductive layer, depositing an insulating layer over the etch stop layer, forming an aperture in the insulating layer and the etch stop layer, providing a barrier material at a bottom and sides of the aperture to form a barrier layer, providing a seed layer over the barrier layer, providing a controlled low energy ion implantation into the seed layer, and filling the aperture with a via material.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
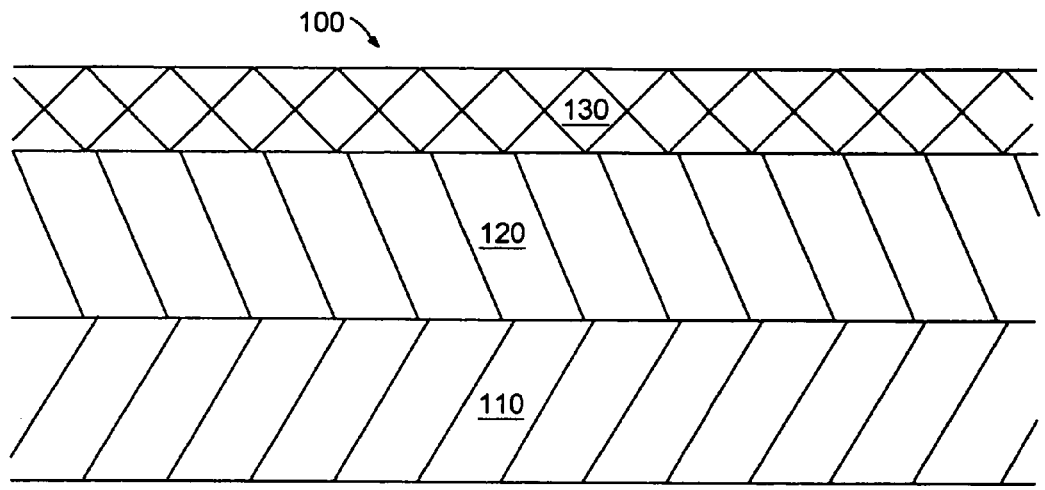
FIG. 1 is a schematic cross-sectional view representation of a portion of an integrated circuit, showing seed and barrier layers in accordance with an exemplary embodiment.

Referring to FIG. 1, a portion 100 of an integrated circuit includes a substrate layer 110, a barrier layer 120, and a seed layer 130. Substrate layer 110 can be a dielectric layer or any of a variety of different layers into which diffusion or migration is not wanted.

Barrier layer 120 is provided to prevent diffusion of material into substrate layer 110. Barrier layer 120 can be Tantalum (Ta), Tantalum Nitride (TaN), Titanium Silicon Nitride (TiSiN), or any of a variety of other barrier materials. As an example, barrier layer 120 can have a cross-sectional thickness of 30–70 Angstroms. Seed layer 130 can include copper (Cu) or a copper alloy and can have a cross-sectional thickness of 100–300 Angstroms.

In an exemplary embodiment, seed layer 130 can include different elements which are implanted to form a mixed region with a uniform distribution of elements. For example, seed layer can include metallic elements of $6^{th}$ period (Ta, W, Re, Os, Ir, Pt), metallic elements of $5^{th}$ period (Nb, Mo, Ru, Rh, Pd), and/or metallic elements of $4^{th}$ period (V, Cr, Fe, Co, Ni). Such elements have the characteristics of forming metallic materials with highest melting point and highest density. In one example case, seed layer 130 includes Re or Cr.

Implants forming seed layer 130 can be deposited using ultra low energy ion implantation (ULEII). Using ULEII allows for implantation of a multitude of elements into seed layer 130 without having to manufacture copper alloy targets, as are used in plasma vapor deposition (PVD) tools. ULEII also allows for control of implant concentration and depth. Advantageously, uniform distribution of elements in seed layer 130 can improve electromigration (EM) reliability and adhesion between seed layer 130 and barrier layer 120. EM may be improved by restricting Cu grain growth and stuffing of the grain boundaries by the incorporated alloying elements with gettering of oxygen impurities in the barrier and initial electroplated Cu. Examples of ULEII tools include those used for source drain heavy implants after minor adaptation and manufactured by Applied Materials, Varian and other manufacturers.

Figure 2:
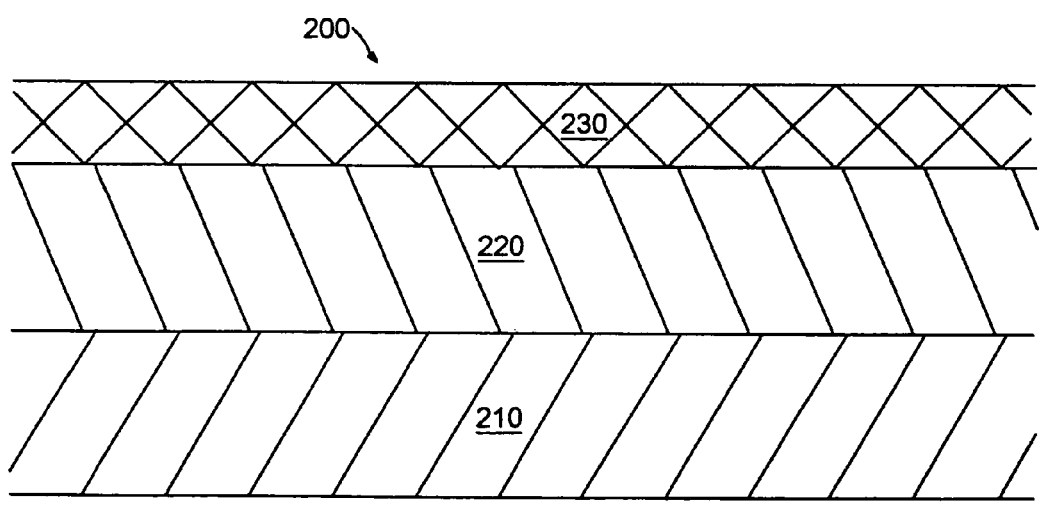
FIG. 2 is a schematic cross-sectional view representation of a portion of an integrated circuit, showing a seed implanted layer in accordance with another exemplary embodiment.

Referring to FIG. 2, a portion 200 of an integrated circuit includes a dielectric layer 210, a barrier layer 220, and a seed implanted layer 230. Dielectric layer 210 can include any of a variety of dielectrics. Dielectric layer 210 can be a layer through which a via passes to electrically connect layers as described in reference to FIG. 3.

Barrier layer 220 can be Tantalum (Ta), Tantalum Nitride (TaN), Titanium Silicon Nitride (TiSiN), or any other barrier material. Barrier layer 220 can have a cross-sectional thickness of 30–70 Angstroms. Barrier layer 220 can be deposited by ALD and/or CVD.

In yet another exemplary embodiment, implantation of elements into seed implanted layer 230 can modify the Cu-alloy in seed implanted layer 230, forming a modified alloy layer and improving electromigration reliability. Implanted elements in seed implanted layer 230 can include Zn, Sn, Cr, Ca, Ag, or In. Implantation can involve use of a ULEII process. In an alternative embodiment, seed implanted layer 230 can receive additional element implants by PVD, CVD, or ALD processes. As an example, seed implanted layer 230 has a thickness of 10–30 Angstroms. A thermal process can be used to facilitate the intermixing of implants with the copper alloy in seed implanted layer 230. In one example case, seed implanted layer 230 includes Zn or Ca. Selected elements can form CuZn and CuCa layers, which provide seed implanted layers with lowered electrical resistance. These CuZn and CuCa seed layers also form interconnects with increased electromigration resistance.

Advantageously, the exemplary embodiments described with reference to FIGS. 1–2 can form an EM resistant layer or section that improves reliability. The EM resistant layer or section includes an implanted layer that is as part of a section of layers. As an example, seed implanted layer 230 described with reference to FIG. 2 is an implanted layer proximate barrier layer 220.

The seed and barrier layers described with reference to FIGS. 1–2 can be included in a conformal layer section in a trench used for a via. The via can be configured to electrically connect two layers, such as, two conductive layers separated by a dielectric layer and connected by a via.

Figure 3:
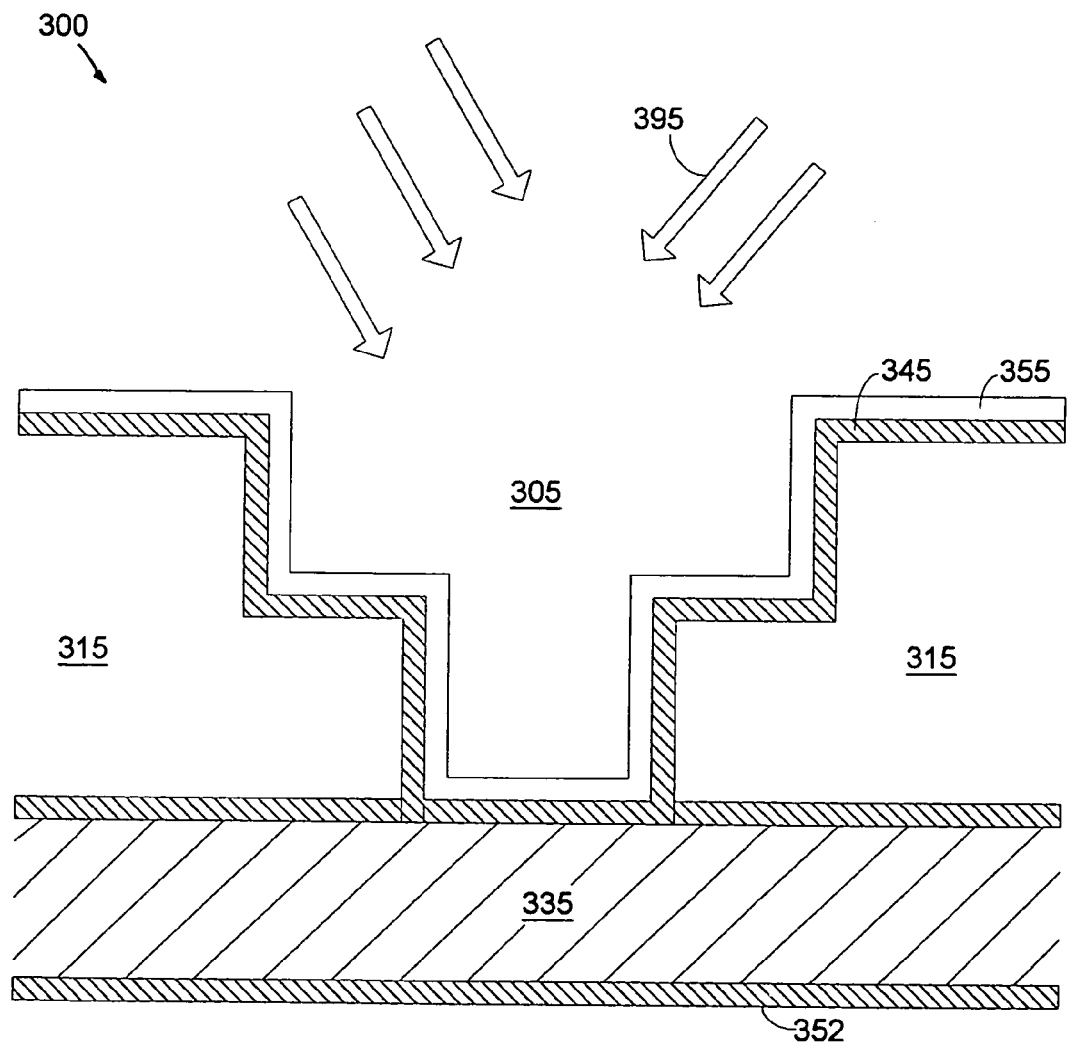
FIG. 3 is a schematic cross-sectional view representation of a portion of an integrated circuit, showing a implantation step.

With reference to FIG. 3, a schematic cross-sectional view representation of a portion 300 of an integrated circuit (IC) includes an aperture 305, a dielectric layer 315, an etch stop layer 325, a copper layer 335, a barrier layer 345, and a seed layer 355. Barrier layer 345 and seed layer 355 form a conformal layer section which can include an implanted layer such as seed layer 130 or seed implanted layer 230 described with respect to FIGS. 1–2.

Portion 300 is preferably part of an ultra-large-scale integrated (ULSI) circuit having millions or more transistors. Portion 300 is manufactured as part of the IC on a semiconductor wafer, such as, a silicon wafer.

Aperture 305 is formed in preparation for the creation of a via by etching a portion of dielectric layer 315 and etch stop layer 325. Aperture 305 can have a cross-sectional width of 50–200 nm. Aperture 305 can also have two sections, one having a smaller width than another. For example, a top section of aperture 305 can have a cross-sectional width of 100–150 nm and a bottom section of aperture 305 can have a cross-sectional width of 70–100 nm.

In an exemplary embodiment, dielectric layer 315 is an oxide material and etch stop layer 325 is Silicon Nitride (SiN) or other suitable material. Etch stop layer 325 prevents diffusion of copper from copper layer 335 into dielectric layer 315.

Copper layer 335 can be a layer of copper positioned in proximate location to via section 320. Copper layer 335 can be an alloy including copper (Cu). In an alternative embodiment, copper layer 330 is a stack of several layers. In another embodiment, copper layer 330 is an aluminum or other conductive layer, such as an aluminum layer including copper.

Barrier layer 345 can be Tantalum (Ta), Titanium Nitride (TiN), Titanium Silicon Nitride (TiSiN), Tungsten Nitride (WNx), or other suitable material. In an exemplary embodiment, barrier layer 345 has a cross sectional thickness of 30–70 Angstroms. Barrier layer 345 can be deposited by ALD and/or CVD. The barrier properties of barrier layer 345 can be enhanced by the addition of an implant, such as, B, P, Si, or Ge.

Seed layer 355 can be a copper alloy, such as, an alloy including C, S, Cl and/or doped with any other suitable material. Seed layer 355 can be deposited by ultra-low energy ion implantation (ULEII). In an exemplary embodiment, seed layer 355 has a cross sectional thickness of 100–300 Angstroms.

In an exemplary method of fabricating portion 300, once copper layer 335 is deposited, etch stop layer 325 is deposited over copper layer 335 and dielectric layer 315 is deposited over etch stop layer 325. A resist layer is then deposited over dielectric layer 315. The resist layer is used in the patterning and etching in dielectric layer 315 and etch stop layer 325 to form aperture 305. The resist layer is removed before depositing via material in aperture 305 and depositing a conductive layer electrically connected to copper layer 335 by the via.

Before depositing via material in aperture 305, barrier layer 345 and seed layer 355 are formed along walls of aperture 305. Barrier layer 345 can be formed by ALD and/or CVD. Seed layer 355 can be formed by ULEII.

In an exemplary embodiment, after formation of barrier layer 345 and seed layer 355, an implant 395 can be made by an angle implant or an angle implant along with a no-angle implant. Implant 395 can be 35 and/or 65 degrees. The angle implant can be 35 to 90 degrees. In an exemplary embodiment, implant 395 is a dose of the species calcium (Ca), for example, in the range of IE15 to IE17 atoms/cm$^2$ forming a doped monolayer, and is implanted at an energy, such as, 0.25 KeV –20.0 KeV, depending on the atomic number and weight of the element to be implanted and required depth. Implant 395 can form an implant layer such as the implant layers described with reference to FIGS. 1–2.

One technique to achieve implantation of implant 395 at a titled angle is by rotating the integrated circuit wafer including portion 300. As such, an implanting device can be directed in one direction and, due to the rotation of the integrated circuit wafer, implant 395 can be provided along side walls all around the aperture of via section 320. In another embodiment, the wafer is tilted to control distribution of implant 395.

Advantageously, the addition of implant 395 allows for the creation of a seed layer including a seed implant as described with reference to FIG. 2.

Implanting elements, such as, B, P, or Ge after copper seed deposition allows for the creation of mixed layers with uniform distribution of elements. As an example, elements can be implanted using an energy of 1–2 KeV and a dose of 5–7 E15 cm$^2$. Such mixed layers including implanted elements can improve adhesion between layers and, further, electromigration reliability. They can also form amorphous portions of barrier layers without large amounts of grain boundaries.

Figure 4:
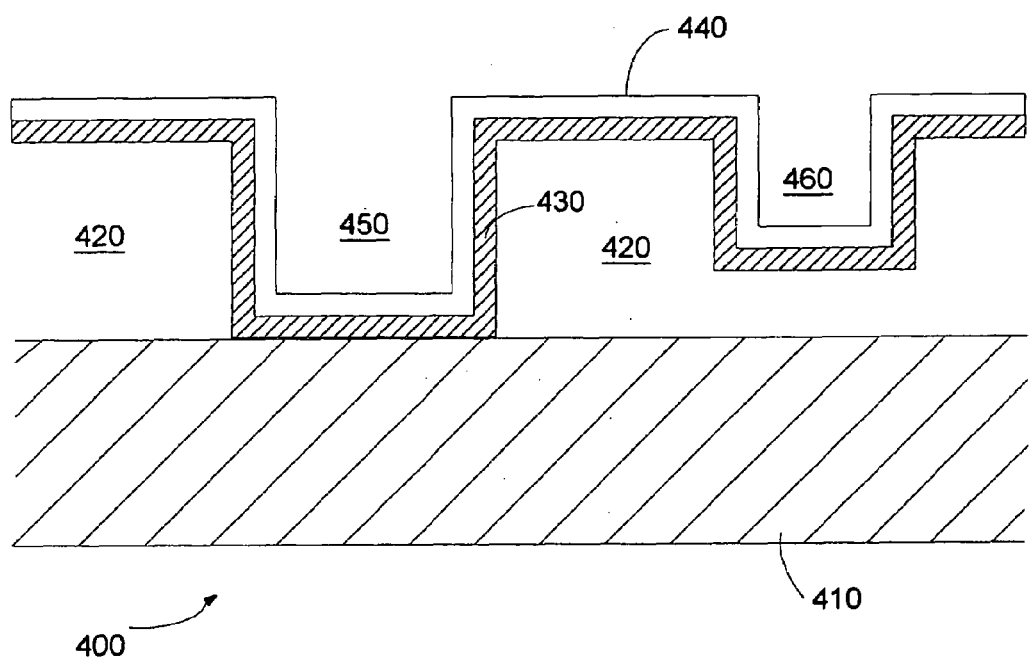
FIG. 4 is a schematic cross-sectional view representation of a portion of an integrated circuit, showing a seed implanted layer in accordance with yet another exemplary embodiment.

FIG. 4 illustrates a portion 400 of an integrated circuit, including a conductive layer 410, a dielectric layer 420, a barrier layer 430, and a seed layer 440. Portion 400 includes a via section 450 that can be used to connect metal lines. For example, via section 450 can be used to connect conductive layer 410 with another conductive layer above dielectric layer 420. In an exemplary embodiment, via section 450 is filled with a conductive material or a conductive material including alloy elements. Portion 400 also includes a trench section 460 that can be connected to a gate or other raised structure. Trench section 450 can also be filled with copper, silver, or other conductive materials.

Dielectric layer 420 can be an interlevel dielectric (ILD) layer and can have a thickness of 3,000 to 6,000 Angstroms. Barrier layer 430 can have a thickness of between 10 and 300 Angstroms. Seed layer 440 can have a thickness of between 50 and 1,000 Angstroms.

As with seed layers described with reference to FIGS. 1–3, seed layer 440 includes elements implanted in a ULEII process. Examples of elements that can be implanted include Zn, Sn, Cr, Ca, Ag, or In. Such implanted elements can be reactive with barrier layer 430, thereby reducing resistance and improving electromigration effects. A ULEII process has the advantage of avoiding the manufacture of copper alloy targets, such as those necessary in a plasma vapor deposition (PVD) tooled process.

While the exemplary embodiments illustrated in the figures and described above are presently preferred, it should be understood that these embodiments are offered by way of example only. Other embodiments may include, for example, different methods of implanting species. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

forming a barrier layer along lateral side walls and a bottom of a via aperture, the via aperture being configured to receive a via material that electrically connects a first conductive layer and a second conductive layer;

forming a seed layer proximate and conformal to the barrier layer; and ion implanting elements into the seed layer, wherein the elements can be any one of Zn, Sn, Cr, Ca, Ag, and In, wherein ion implanting elements into the seed layer comprises low energy ion implanting elements into the seed layer, wherein low energy ion implanting comprises implanting at an energy of 0.25 to 2.0 KeV.

2. The method of claim 1, further comprising selectively controlling concentration of the implanted elements.

3. The method of claim 1, wherein the ion implanting is at a dosage concentration of IE15 to IE17 atoms/cm2.

4. The method of claim 1, further comprising tilting the integrated circuit thereby controlling placement of the implanted element on lateral side walls and the bottom of the via aperture.

5. The method of claim 1, further comprising using a thermal process to facilitate mixing of implanted elements and the seed layer.

6. The method of claim 1, wherein the seed layer has a cross-sectional thickness of between 50 and 1,000 Angstroms.

7. The method of claim 1, wherein the seed layer is formed by an angle implant to achieve a uniform distribution of elements.

8. A method of implantation after copper seed deposition in an integrated circuit fabrication process, the method comprising:

providing a first conductive layer over an integrated circuit substrate;

providing a conformal layer at a bottom and sides of a via aperture positioned over the first conductive layer to form a barrier separating the via aperture from the first conductive layer;

providing an ultra-low energy ion implant of any one of Zn, Sn, Cr, Ca, Ag, and In to form a seed layer over the conformal layer, wherein ultra-low energy ion implant occurs at an energy level of 0.25 to 2.0 KeV;

filling the via aperture with a via material; and providing a second conductive layer over the via material such that the via material electrically connects the first conductive layer to the second conductive layer.

9. The method of claim 8, wherein providing an ultra-low energy ion implant to form a seed layer over the conformal layer includes implanting a plurality of elements into the seed layer.

10. The method of claim 8, wherein providing an ultra-low energy ion implant to form a seed layer over the conformal layer includes providing an implant dosage concentration of IE15 to IE17 atoms/cm2.

11. The method of claim 8, wherein providing an ultra-low energy ion implant to form a seed layer over the conformal layer includes providing an implant depth of 50 to 1,000 Angstroms.

12. The method of claim 8, wherein the seed layer has a cross-sectional thickness of 50 to 1,000 Angstroms.

13. A method of forming a via in an integrated circuit, the method comprising:

depositing a first conductive layer;

depositing an etch stop layer over the first conductive layer;

depositing an insulating layer over the etch stop layer;

forming an aperture in the insulating layer and the etch stop layer;

providing a barrier material at a bottom and sides of the aperture to form a barrier layer;

providing a seed layer over the barrier layer;

providing a controlled low energy ion implantation of any one of Zn, Sn, Cr, Ca, Ag, and In into the seed layer, wherein low energy ion implantation comprises an energy level of 0.25 to 2.0 KeV;

filling the aperture with a via material.

14. The method of claim 13, wherein the ion implantation is at an angle of between 35 and 90°.

15. The method of claim 13, wherein control of ion implantation includes tilting the seed layer.

16. The method of claim 13, wherein the ion implantation into the seed layer includes B, P, or Ge elements.

17. The method of claim 13, wherein the barrier layer is Ta, TaN, or TiN.

* * * * *